United States Patent
Senechal et al.

[11] Patent Number: 6,128,202
[45] Date of Patent: Oct. 3, 2000

[54] PROGRAMMABLE LOGIC CONTROLLER SEISMIC SUPPORT BRACKET FOR NUCLEAR APPLICATIONS

[75] Inventors: Raymond R. Senechal, East Hartford; Gary D. Altenhein, Enfield; Donald D. Zaccara, Winsted, all of Conn.

[73] Assignee: CE Nuclear Power LLC, Windsor, Conn.

[21] Appl. No.: 09/017,623

[22] Filed: Feb. 2, 1998

Related U.S. Application Data

[60] Provisional application No. 60/048,920, Jun. 6, 1997.

[51] Int. Cl.[7] ...................................................... H02B 1/01
[52] U.S. Cl. ......................... 361/825; 361/800; 361/801; 361/825; 361/756; 439/341; 439/342; 439/527; 439/534
[58] Field of Search ..................................... 439/341, 342, 439/527, 534; 361/825, 754, 756, 800, 801

[56] References Cited

U.S. PATENT DOCUMENTS

| | | |
|---|---|---|
| 4,866,576 | 9/1989 | Umetsu et al. . |
| 4,899,892 | 2/1990 | Rheault . |
| 5,140,501 | 8/1992 | Takahashi et al. ...................... 361/415 |
| 5,209,356 | 5/1993 | Chaffee . |
| 5,216,578 | 6/1993 | Zenitani et al. ......................... 361/383 |
| 5,740,011 | 4/1998 | Kobayashi et al. ...................... 361/685 |
| 5,760,998 | 6/1998 | Berberich et al. .................... 360/97.02 |
| 5,825,616 | 10/1998 | Howell et al. ........................... 361/684 |

FOREIGN PATENT DOCUMENTS

WO 92/19031  10/1992  WIPO .

OTHER PUBLICATIONS

International Preliminary Examination Report of Apr. 1, 1999.

*Primary Examiner*—Jeffrey Gaffin
*Assistant Examiner*—Tuan Dinh
*Attorney, Agent, or Firm*—Henry T. Crenshaw; Ronald P. Kananen; Rader, Fishman & Grauer

[57] ABSTRACT

To prevent damage to the electrical connections between PLC modules and a backplane during seismic and other vibrational disturbances, a bracket is used having two parallel side members attached to the backplane and a lower support bar connected between the side members to support the PLC modules in the vertical direction. An upper support bar may also be provided between the side plates to hold the PLC modules in the bracket and further prevent vertical movement. The upper and lower support bars may also provide vertical members or a rest in contact with the PLC modules and having a high coefficient of friction to prevent lateral movement of the PLC modules with respect to the backplane.

49 Claims, 7 Drawing Sheets

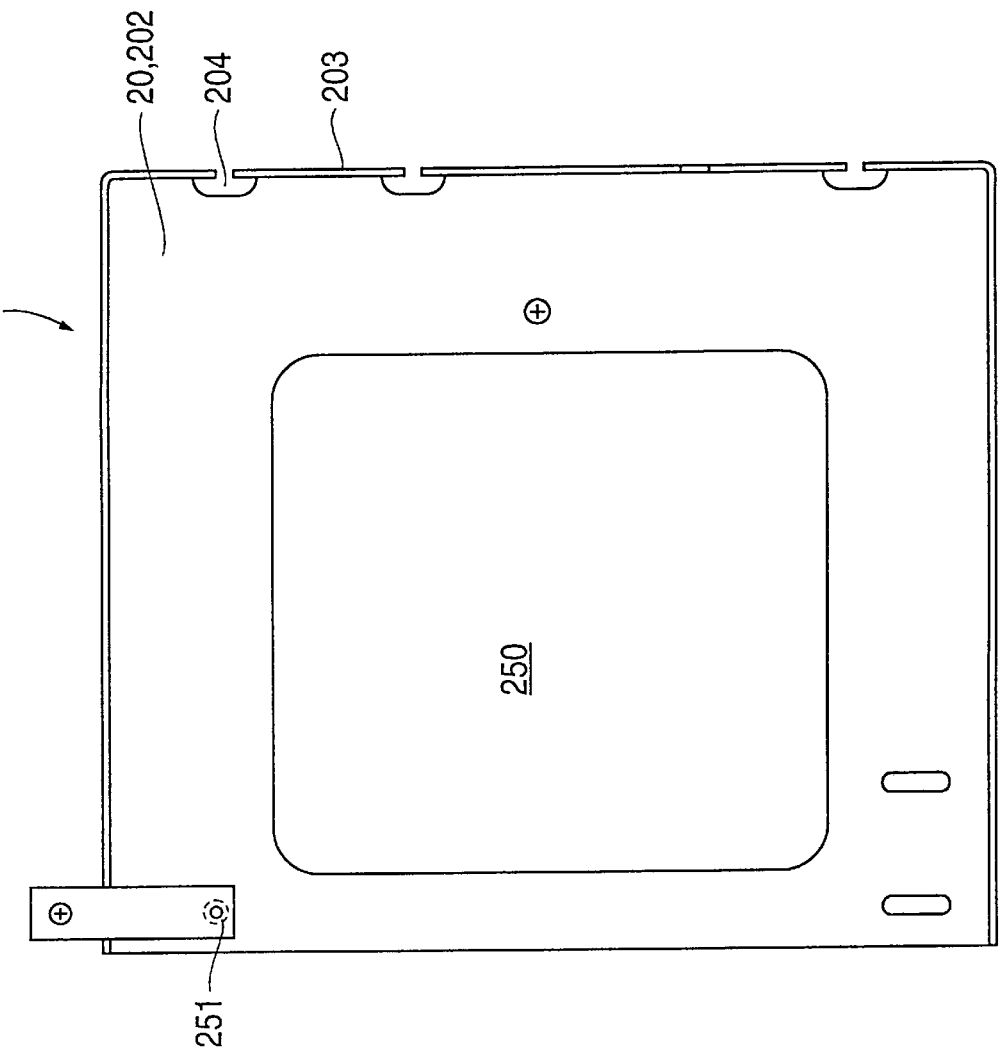
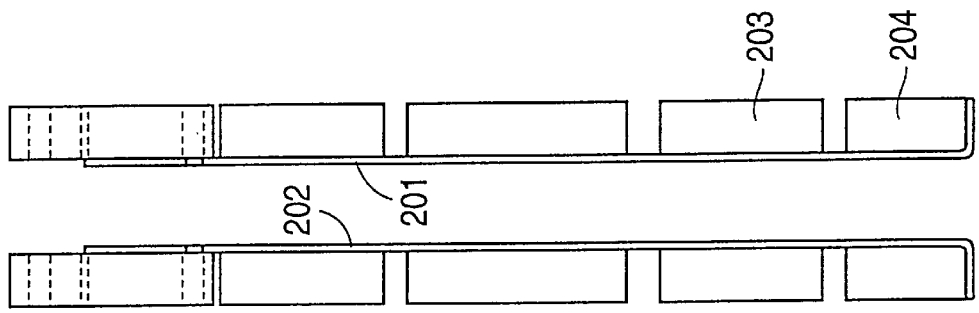

FIG. 3B

| QTY REQ'D | ITEM NO | PART OR IDENTIFYING NO | NOMENCLATURE OR DESCRIPTION |
|---|---|---|---|
| 3 ft | 13 | 1/8 THK x .50 | SILICONE SPONGE RUBBER ADHESIVE BACKED (CHR) |
| 4 | 12 | WL-SR1/4X | WASHER LOCK 1/4 |
| 4 | 11 | WP-AN1/4X | WASHER PLAIN 1/4 |
| 4 | 10 | SC-A1/4-20-8CX | SCREW CAP 1/4-20 x .50 |
| 2 | 9 | S-S10-32-8PX | SCREW PAN HD #10-32 x .50 |
| 2 | 8 | FPC-6 | CABLE PIN RETAINER (REID) |
| 2 | 7 | FPD-650 | QUICK RELEASE PIN (REID) |
| 5 in | 6 | #1018 | .63 SQUARE CRS BAR |
| 2 sq ft | 5 | ASTM A366 | 12 GA (.105) CRS |
| 8 in | 4 | #1018 | .75 x .13 THK CRS |
| 3.5 ft | 3 | ASTM A500 GrB | .75 x .75 x .063 GA STEEL TUBE |
| 2 | 2 | WL-SR10X | WASHER LOCK #10 |
| 2 | 1 | WP-AN10X | WASHER PLAIN #10 |

BILL OF MATERIAL

PROGRAMMABLE LOGIC CONTROLLER
SEISMIC SUPPORT BRACKET
FOR NUCLEAR APPLICATIONS

| SIZE B | RE : C970230 | SHEET 4 CONT. ON 5 |

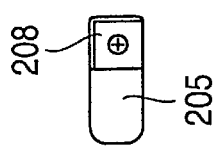
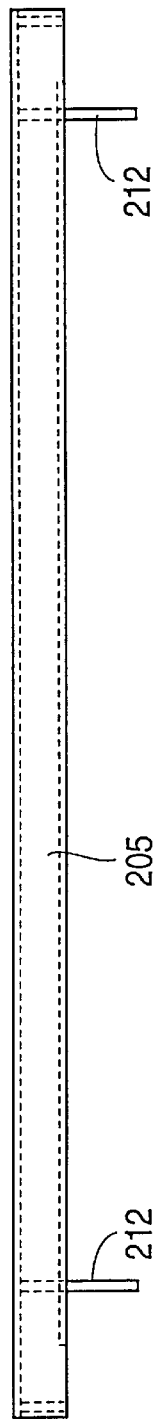
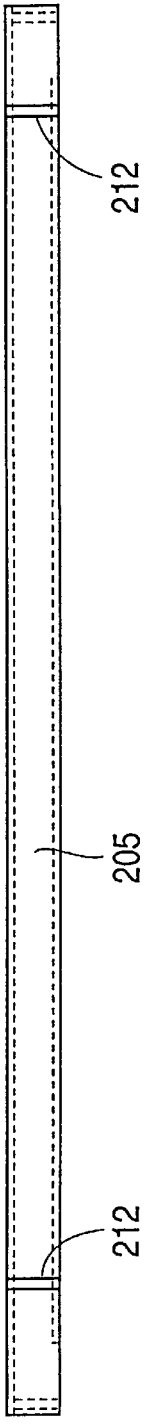

PROGRAMMABLE LOGIC CONTROLLER SEISMIC SUPPORT BRACKET FOR NUCLEAR APPLICATIONS

This application claims benefit of Provisional application Ser. No. 60/048,920 filed Jun. 6, 1997.

FIELD OF THE INVENTION

The present invention relates to the field of supporting critical electrical components during a seismic or other vibrational disturbance. More particularly, the present invention relates to a bracket for supporting programmable logic controller modules during a seismic or other vibrational disturbance in a critical system which must maintain its operation and function such as the control or monitoring system for a nuclear power plant.

BACKGROUND OF THE INVENTION

Programmable logic controller modules ("PLC modules") can be used in a wide variety of applications. The versatility of the PLC modules results from their ability to be individually programmed and wired to perform different logic control functions and their modular construction which allows them to be inserted and removed from a system as needed. Each individual PLC module has a specified input, output, and coupling or control function.

The module is made from steel plates joined together to form a box. A printed circuit board, with all the circuits necessary to perform the module's specified function, is disposed in the box.

As shown in FIG. 1, a PLC module 3, or a series of such modules, are attached to a backplane 1. The pins of a bus connector 4 on the module 3 mate with holes in a bus connector 2 on the backplane 1 to create the electrical bus connection between the module and the backplane 1. Interfacing input/output wiring, a bus cable or other communication cable (not shown) leads from the front 8 of the module 3.

The PLC module 3 is attached to the backplane 1 by a hook 5. After the module 3 is hooked to the backplane 1, it swings, as illustrated by the arrow in FIG. 1, to mate the bus connectors 2 and 4. A screw 6 is the provided which extends through the lower part of the module 3 and screws into a threaded hole in the backplane 1. The hook 5 and screw 6 secure the module 3 to the backplane 1.

However, there is no lateral support and marginal vertical support for the module 3. Accordingly, if there are any vibrations or disturbances the module 3 may be caused to swing from side to side or lift vertically, and the pins of the bus connector 4 may be damaged. The result may be a faulty electrical connection between the module 3 and the backplane 1.

If the PLC module is exposed to an environment where disturbances or vibrations are common, this damage may be significant and recurring. These same vibrations, if unchecked, may also result in faulty operation of the modules electromechanical components, such as relays, by causing contact bounce.

Even if the PLC module is isolated from common physical disturbances, the eventuality of an earthquake may still damage the connection. While this would not normally be a risk worth considering, if the PLC module is used as part of the control or monitoring system for a nuclear power plant, it must function before, during and after any seismic disturbance to prevent the possibility of a nuclear accident. Such earthquake-proofing is mandated by law for nuclear power plants.

Accordingly, there is a need in the art for a device and method of supporting PLC modules mounted to a backplane to prevent lateral and vertical movement and consequent damage to the electrical connection between the modules and the backplane.

SUMMARY OF THE INVENTION

It is an object of the present invention to meet the above described needs and others. More particularly, it is an object of the present invention to provide a bracket and method of using a bracket to support PLC modules to prevent damage to the electrical connections.

Additional objects, advantages and novel features of the invention will be set forth in the description which follows or may be learned by those skilled in the art through reading these materials or practicing the invention.

To achieve the stated and other objects of the present invention, as embodied and described below, the invention may include a bracket for supporting and protecting PLC modules during seismic and vibrational disturbances.

The bracket may have first and second side plates disposed parallel to each other, the first and second side plates each having a flanged end for connection to a backplane. It may be necessary to provide one or more notches in the flanged ends of the first and second side plates for receiving therein obstructions projecting from the backplane so that the side plates can be securely attached to the backplane.

A lower support bar is then connected between the first and second side plates for supporting one or more PLC modules connected to the backplane. The bracket may also include an upper support bar connected between the first and second side plates for enclosing the one or more PLC modules within the bracket. Preferably, quick release pins are used to secure the upper support bar to the first and second side plates. To prevent loss, lanyards may be provided for securing the quick release pins to the first and second side plates, respectively.

The lower support bar may have a rest in contact with the one or more PLC modules. The rest should have a coefficient of friction sufficiently high to suppress lateral movement of the one or more PLC modules supported by the lower support bar. For example, the rest may be made of rubber. A similar rest may also be disposed on the upper support bar in contact with upper surfaces of the one or more PLC modules supported by the lower support bar to suppress lateral movement of the one or more PLC modules.

Additionally, the lower and upper support bars may include one or more vertical members disposed parallel to the first and second side plates for preventing lateral movement of the one or more PLC modules supported by the lower support bar.

Finally, the bracket of the present invention may include a wire support rack for supporting wires connected to the one or more PLC modules.

The present invention also encompasses a method for supporting and protecting PLC modules during seismic and vibrational disturbances by supporting a PLC module connected to a backplane with a lower support bar which is connected between first and second side plates, the first and second side plates being parallel and connected to the backplane.

The method of the present invention may also include such steps as: holding the PLC module against the lower support bar with an upper support bar connected between the first and second side plates; providing a rest disposed on the upper or lower support bar, the rest having a coefficient of friction sufficiently high to suppress lateral movement of the PLC module supported by the lower support bar; preventing lateral movement of the PLC module supported by the lower support bar by providing at least one vertical member disposed on the upper or lower support bar parallel to the first and second side plates; and supporting wires connected to the PLC modules with a wire support rack.

BRIEF DESCRIPTION OF THE DRAWINGS

The accompanying drawings illustrate the present invention and are a part of the specification. Together with the following description, the drawings demonstrate and explain the principles of the present invention. In the drawings:

FIGS. 3A1 and 3A2 illustrate a front and side view, respectively, of the bracket of the present invention.

FIG. 3B is a table providing specifications for the bracket illustrated in FIG. 3A.

FIGS. 5A, 5B and 5C are enlarged front, top and side views, respectively, of the upper support bar.

DETAILED DESCRIPTION OF THE PREFERRED EMBODIMENT

Using the drawings, the preferred embodiment of the present invention will now be explained.

Figure 1:
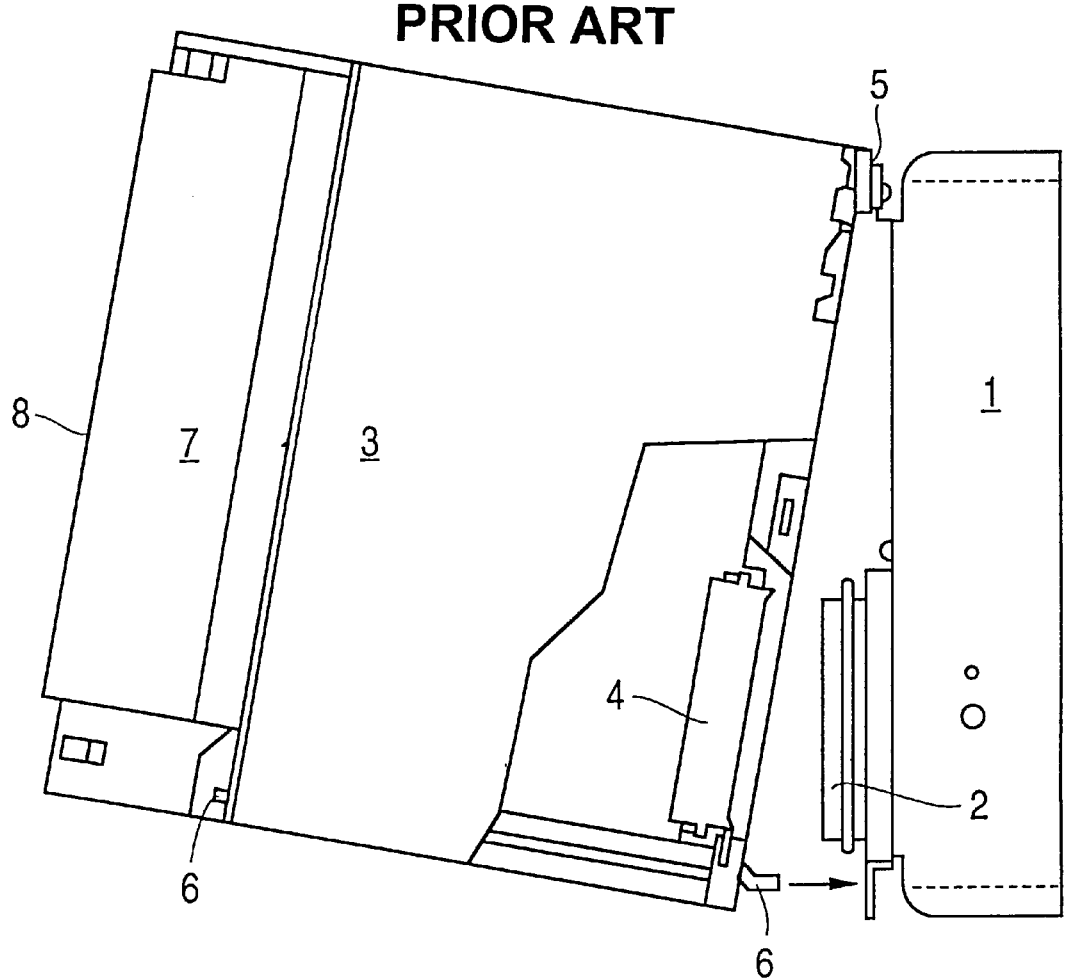
FIG. 1 illustrates a PLC module secured to a backplane.
Figure 2A:
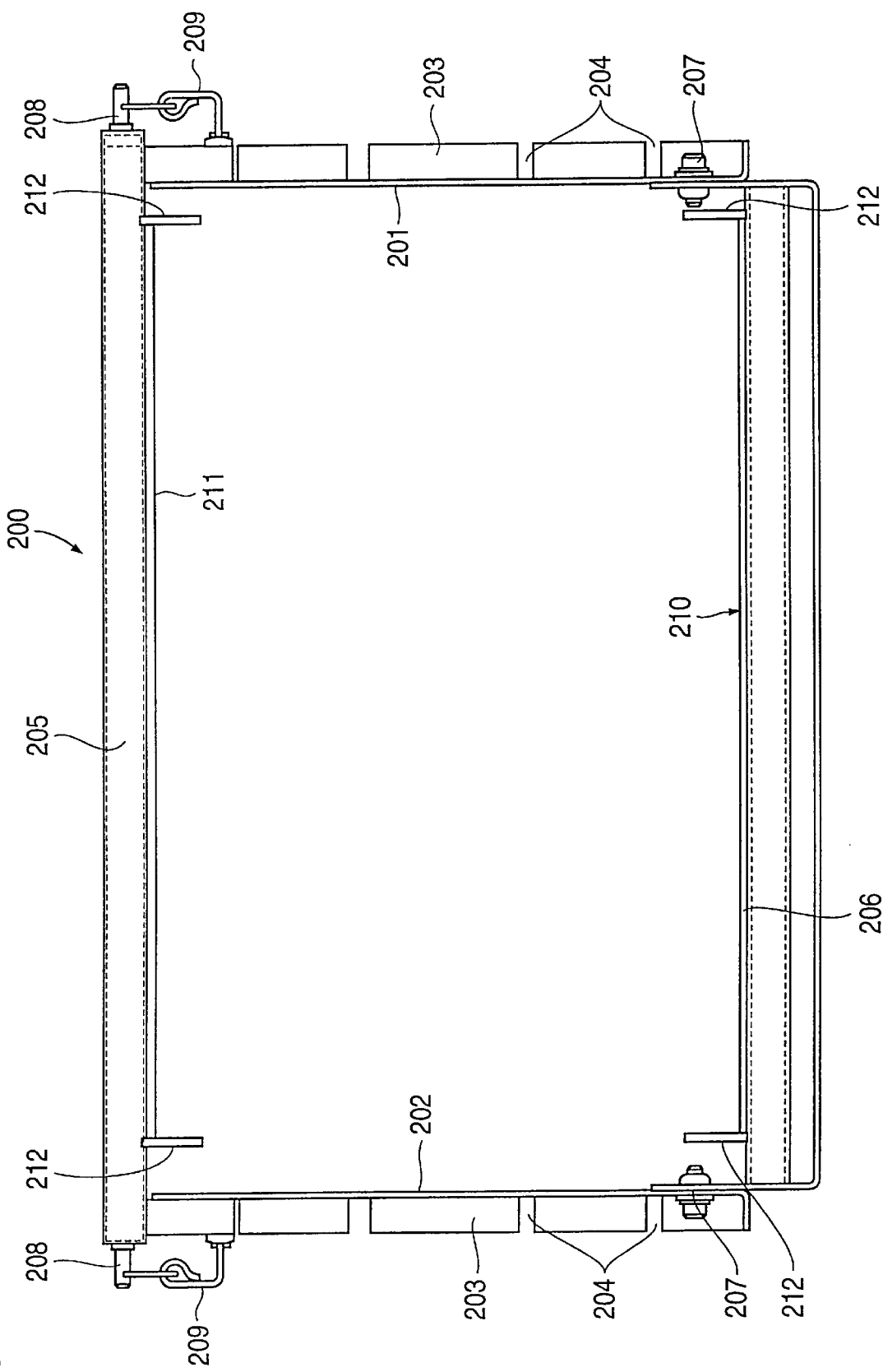
FIG. 2A illustrates a front view of the bracket of the present invention.

As shown in FIG. 2A, the bracket of the present invention includes two side plates 201 and 202. Each side plate 201, 202 has a flanged end 203 for securing the side plates 201, 202 to the support for a backplane (not shown). Each of the flanged end 203 has a series of notches cut therein. The notches are spaced in the same configuration as screws or other fasteners used to support a backplane. Thus, the side plates 201, 202 can be secured along with any standard backplane. The notches also allow the side plates 201, 202 to be installed over any washers used in fastening the backplane to its support.

The bracket shown in FIG. 2A further includes an upper support bar 205 and a lower support bar 206. The lower support bar is preferably fixed between the two side plates 201, 202 by, for example, nuts and bolts. The upper support bar 205 is secured to the two side plates 201, 202 by a quick release pin 208 on each side. The quick release pins 208 may be attached to the side plates 201, 202 by lanyards 209 to prevent the quick release pins 208 from being lost.

The lower support bar 206 may include a rest 210 made of, for example, rubber. When the side plates 201, 202 are secured by flanged ends 203 to the support for a backplane, the end of a PLC module, which is opposite the end electrically connected and secured to the backplane, may rest on the rest 210 and be supported by lower support bar 206.

The rubber of rest 210 creates friction with the PLC module, preventing the module from swinging in a lateral direction in the event of a seismic or other disturbance. An identical rest 211 may be provided on the upper support bar 205 to further the same purpose.

Upper and lower support bars 205, 206 may also include vertical members 212. Vertical members 212 serve to hold the outermost PLC modules of a series of modules being supported by the bracket 200 of the present invention. Vertical members 212 thus prevent lateral movement of the entire series of modules (not shown).

Figure 2B:
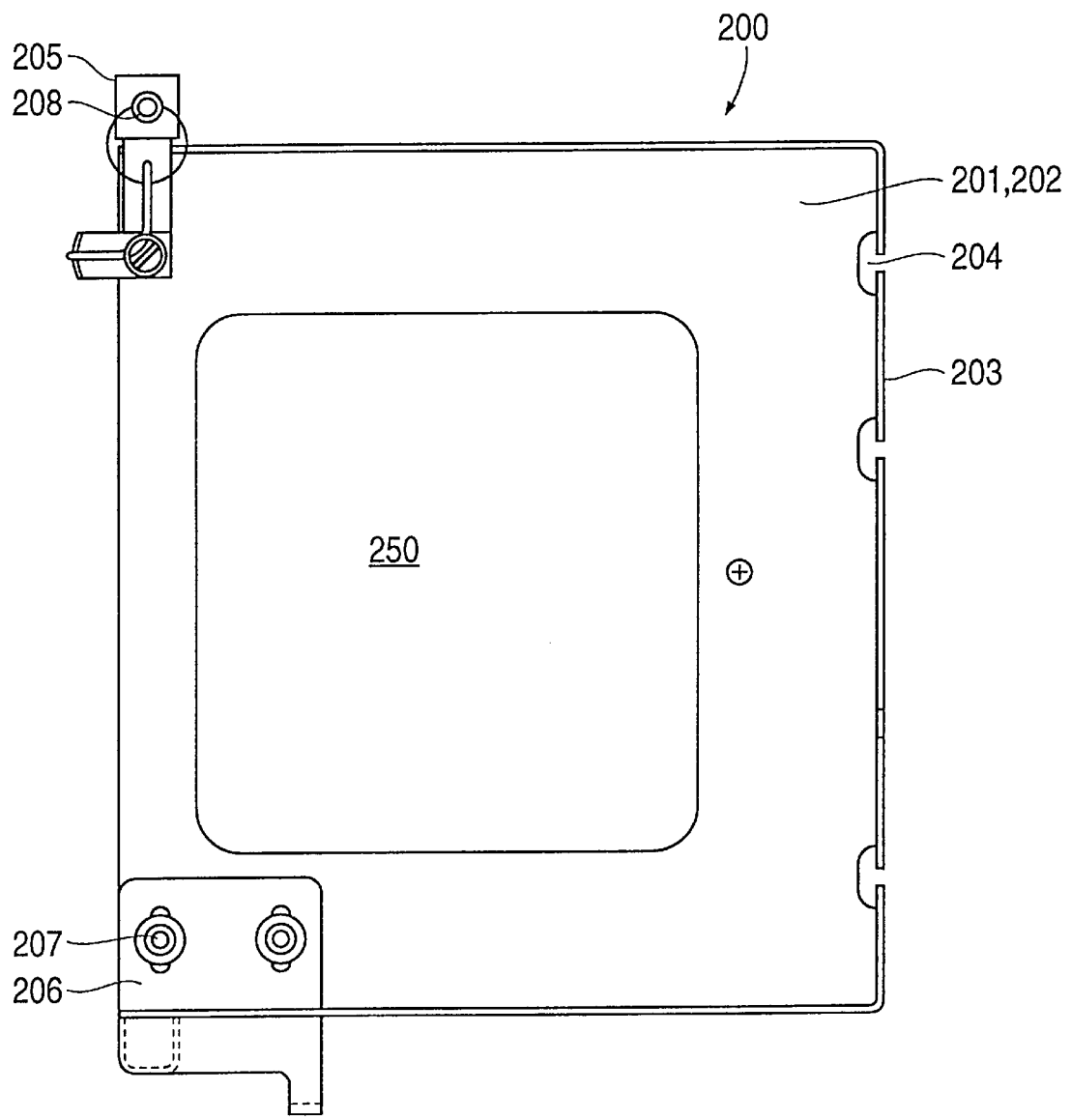
FIG. 2B illustrates a side view of the bracket of the present invention.

As shown in FIG. 2B, each of the two side plates 201, 202 may be provided with a cut-out portion 250. The cut-out portion reduces the weight of the side plates 201, 202 and also allows access to electrical components that may be disposed on the backplane.

FIG. 3A illustrates a side view of side plates 201, 202 and a front view of the side plates 201, 202. A hole 251 may be provided in each of the side plates 201, 202 for securing the lanyard that retains the quick release pins. FIG. 3B is a table providing specifications for an exemplary embodiment of the bracket illustrated in FIG. 3A.

Figure 4C:
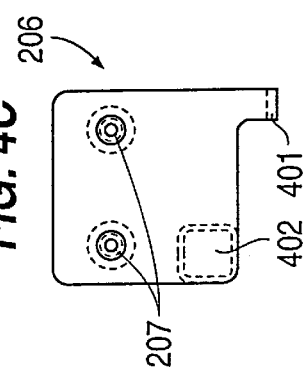
FIGS. 4A, 4B and 4C are enlarged front, top and side views, respectively, of the lower support bar.
Figure 4B:
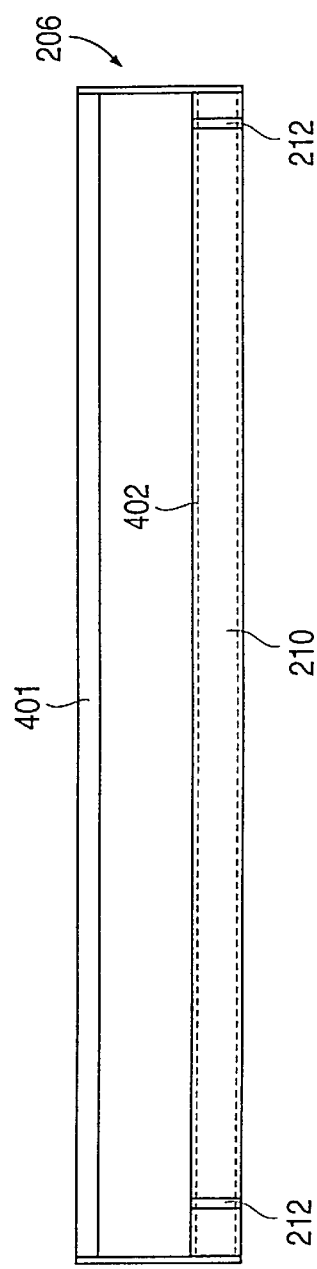
Figure 4A:
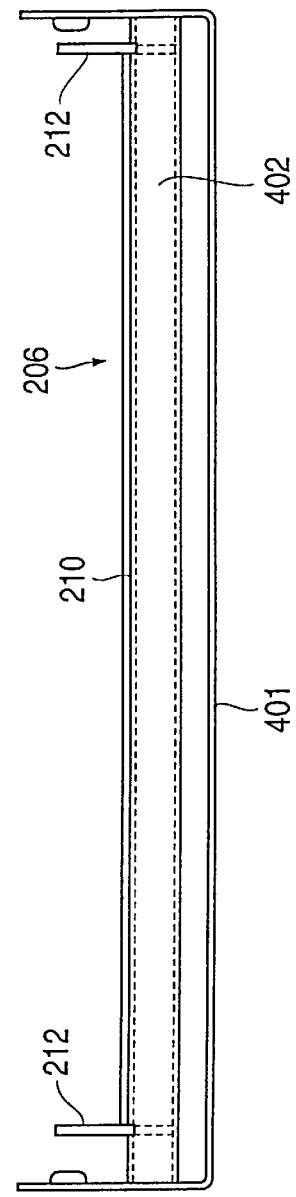

FIG. 4 provides a top, front and side views of the lower support bar 206. A tubular member 402, having, for example, a roughly square cross-section, with rubber rest 210 disposed thereon, may comprise the lower support bar 206.

The lower support bar 206 may also have a wire support rack 401 which runs parallel to the tubular member 402. The wire support rack 401 can be used to support the bus cables or other communication wires leading from the ends of the PLC modules supported by the lower support bar 206. The support of the cables of communication wires further relieves the stress on the PLC module and its connection to the backplane.

FIGS. 5A, 5B and 5C provide enlarged views of the upper support bar 205. Because the upper support bar 205 is secured by quick release pins 208, it can readily be removed without tools. Once the upper support bar 205 is removed, any PLC modules being supported by the bracket 200 of the present invention, can be tilted, unhooked from the backplane and replaced, inspected, etc. Accordingly, the present invention provides a bracket which prevents seismic or other disturbances from damaging the connections between PLC modules and backplanes, but also allows the PLC modules to be quickly and easily accessed for maintenance or replacement.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated.

What is claimed is:

1. A bracket for supporting and protecting PLC modules during seismic and vibrational disturbances, comprising:

first and second side plates being disposed parallel to each other, said first and second side plates each having a flanged end extending outwardly therefrom; and a lower support bar connected between said first and second side plates.

2. A bracket as claimed in claim 1, further comprising an upper support bar connected between said first and second side plates.

3. A bracket as claimed in claim 2, further comprising first and second quick release pins which secure said upper support bar to said first and second side plates.

4. A bracket as claimed in claim 3, further comprising first and second lanyards securing said first and second quick release pins to said first and second side plates, respectively.

5. A bracket as claimed in claim 1, further comprising a rest disposed on said lower support bar, said rest having a coefficient of friction sufficiently high to suppress lateral movement of one or more PLC modules being supported by the bracket.

6. A bracket as claimed in claim 5, wherein said rest is made of rubber.

7. A bracket as claimed in claim 1, wherein said flanged ends of said first and second side plates comprise at least one notch.

8. A bracket as claimed in claim 1, further comprising at least one vertical member disposed on said lower support bar parallel to said first and second side plates.

9. A bracket as claimed in claim 2, further comprising at least one vertical member disposed on said upper support bar parallel to said first and second side plates for.

10. A bracket as claimed in claim 2, further comprising a rest disposed on said upper support bar, said rest contacting upper surfaces of one or more PLC modules being supported by the bracket and having a coefficient of friction sufficiently high to suppress lateral movement of said one or more PLC modules.

11. A bracket as claimed in claim 10, wherein said rest is made of rubber.

12. A bracket as claimed in claim 1, wherein said lower support bar further comprises a wire support rack.

13. A method for supporting and protecting PLC modules during seismic and vibrational disturbances, comprising supporting a PLC module with a lower support bar which is connected between first and second side plates, said first and second side plates being parallel and each having a flanged end extending outwardly therefrom.

14. A method as claimed in claim 13, further comprising holding said PLC module against said lower support bar with an upper support bar connected between said first and second side plates.

15. A method as claimed in claim 13, further comprising providing a rest disposed on said lower support bar, said rest having a coefficient of friction sufficiently high to suppress lateral movement of said PLC module supported by said lower support bar.

16. A method as claimed in claim 15, wherein said rest is made of rubber.

17. A method as claimed in claim 13, further comprising preventing lateral movement of said PLC module supported by said lower support bar by providing at least one vertical member disposed on said lower support bar parallel to said first and second side plates.

18. A method as claimed in claim 14, further comprising preventing lateral movement of said PLC module supported by said lower support bar by providing at least one vertical member disposed on said upper support bar parallel to said first and second side plates.

19. A method as claimed in claim 14, further comprising providing a rest on said upper support bar, and contacting an upper surface of said PLC module with said rest to suppress lateral movement of said PLC module.

20. A method as claimed in claim 13, further comprising providing support for wires connected to said PLC modules with a wire support rack.

21. A bracket for supporting and protecting PLC modules during seismic and vibrational disturbances, comprising:
   first and second side plates being disposed parallel to each other, said first and second side plates each having a flanged end extending outwardly therefrom;
   a lower support bar connected between said first and second side plates; and
   at least one vertical member disposed on said lower support bar parallel to said first and second side plates.

22. A bracket as claimed in claim 21, further comprising an upper support bar connected between said first and second side plates.

23. A bracket as claimed in claim 22, further comprising first and second quick release pins which secure said upper support bar to said first and second side plates.

24. A bracket as claimed in claim 23, further comprising first and second lanyards securing said first and second quick release pins to said first and second side plates, respectively.

25. A bracket as claimed in claim 21, further comprising a rest disposed on said lower support bar, said rest having a coefficient of friction sufficiently high to suppress lateral movement of one or more PLC modules being supported by the bracket.

26. A bracket as claimed in claim 25, wherein said rest is made of rubber.

27. A bracket as claimed in claim 21, wherein said flanged ends of said first and second side plates comprise at least one notch.

28. A bracket as claimed in claim 22 further comprising at least one vertical member disposed on said upper support bar parallel to said first and second side plates for.

29. A bracket as claimed in claim 22, further comprising a rest disposed on said upper support bar, said rest contacting upper surfaces of one or more PLC modules being supported by the bracket and having a coefficient of friction sufficiently high to suppress lateral movement of said one or more PLC modules.

30. A bracket as claimed in claim 29, wherein said rest is made of rubber.

31. A bracket as claimed in claim 21, wherein said lower support bar further comprises a wire support rack.

32. A bracket for supporting and protecting PLC modules during seismic and vibrational disturbances, comprising:
   first and second side plates being disposed parallel to each other, said first and second side plates each having a flanged end extending outwardly therefrom; and
   a lower support bar connected between said first and second side plates, wherein said lower support bar comprises a wire support rack.

33. A bracket as claimed in claim 21, further comprising an upper support bar connected between said first and second side plates.

34. A bracket as claimed in claim 33, further comprising first and second quick release pins which secure said upper support bar to said first and second side plates.

35. A bracket as claimed in claim 34, further comprising first and second lanyards securing said first and second quick release pins to said first and second side plates, respectively.

36. A bracket as claimed in claim 32, further comprising a rest disposed on said lower support bar, said rest having a coefficient of friction sufficiently high to suppress lateral movement of one or more PLC modules being supported by the bracket.

37. A bracket as claimed in claim 36 wherein said rest is made of rubber.

38. A bracket as claimed in claim 32, wherein said flanged ends of said first and second side plates comprise at least one notch.

39. A bracket as claimed in claim 32, further comprising at least one vertical member disposed on said lower support bar parallel to said first and second side plates.

40. A bracket as claimed in claim 33 further comprising at least one vertical member disposed on said upper support bar parallel to said first and second side plates for.

41. A bracket as claimed in claim 33, further comprising a rest disposed on said upper support bar, said rest contacting upper surfaces of one or more PLC modules being supported by the bracket and having a coefficient of friction sufficiently high to suppress lateral movement of said one or more PLC modules.

42. A bracket as claimed in claim 41, wherein said rest is made of rubber.

43. A method for supporting and protecting PLC modules during seismic and vibrational disturbances, comprising supporting a PLC module with a lower support bar which is connected between first and second side plates, said first and second side plates being parallel and each having a flanged end extending outwardly therefrom; and provide support for wires connected to said PLC modules with a wire support rack.

44. A method as claimed in claim 43, further comprising holding said PLC module against said lower support bar with an upper support bar connected between said first and second side plates.

45. A method as claimed in claim 43, further comprising providing a rest disposed on said lower support bar, said rest having a coefficient of friction sufficiently high to suppress lateral movement of said PLC module supported by said lower support bar.

46. A method as claimed in claim 45, wherein said rest is made of rubber.

47. A method as claimed in claim 43, further comprising preventing lateral movement of said PLC module supported by said lower support bar by providing at least one vertical member disposed on said lower support bar parallel to said first and second side plates.

48. A method as claimed in claim 44, further comprising preventing lateral movement of said PLC module supported by said lower support bar by providing at least one vertical member disposed on said upper support bar parallel to said first and second side plates.

49. A method as claimed in claim 44, further comprising providing a rest on said upper support bar, and contacting an upper surface of said PLC module with said rest to suppress lateral movement of said PLC module.

\* \* \* \* \*

UNITED STATES PATENT AND TRADEMARK OFFICE
CERTIFICATE OF CORRECTION

PATENT NO. : 6,128,202
DATED : October 3, 2000
INVENTOR(S) : Senechal et al.

It is certified that error appears in the above-identified patent and that said Letters Patent is hereby corrected as shown below:

<u>Column 5, claim 9,</u>
Line 16, delete "for".

<u>Column 6, claim 28,</u>
Line 24, delete "for".

<u>Column 6, claim 40,</u>
Line 67, delete "for".

Signed and Sealed this

Sixth Day of November, 2001

Attest:

*Nicholas P. Godici*

NICHOLAS P. GODICI
*Attesting Officer*    *Acting Director of the United States Patent and Trademark Office*